(12) United States Patent  (10) Patent No.: US 9,069,022 B2
Perras et al.  (45) Date of Patent: Jun. 30, 2015

(54) HIGH CURRENT PRECISION RESISTANCE MEASUREMENT SYSTEM

(75) Inventors: Andre Perras, McDonalds Corners (CA); Mark Evans, Smith Falls (CA)

(73) Assignee: Guildline Instruments Limited (CA)

( * ) Notice: Subject to any disclaimer, the term of this patent is extended or adjusted under 35 U.S.C. 154(b) by 660 days.

(21) Appl. No.: 13/359,980

(22) Filed: Jan. 27, 2012

(65) Prior Publication Data

US 2012/0187966 A1    Jul. 26, 2012

Related U.S. Application Data

(63) Continuation-in-part of application No. 12/240,191, filed on Sep. 29, 2008, now Pat. No. 8,106,669.

(60) Provisional application No. 60/975,544, filed on Sep. 27, 2007.

(51) Int. Cl.
   *G01R 27/08*  (2006.01)
   *G01R 27/14*  (2006.01)

(52) U.S. Cl.
   CPC ..................................... *G01R 27/14* (2013.01)

(58) Field of Classification Search
   CPC ........................................................ G01R 27/14

USPC ............................................................. 324/706
See application file for complete search history.

(56) References Cited

U.S. PATENT DOCUMENTS

| 4,050,017 | A |  | 9/1977 | Paufve |
| 4,847,783 | A | * | 7/1989 | Grace et al. ..................... 702/24 |
| 5,225,784 | A |  | 7/1993 | So |
| 5,573,099 | A |  | 11/1996 | Church |
| 5,828,282 | A |  | 10/1998 | Tiemann |
| 6,433,554 | B1 |  | 8/2002 | Kawate |
| 6,466,023 | B2 |  | 10/2002 | Dougherty |
| 6,803,776 | B2 |  | 10/2004 | So |
| 6,953,932 | B2 |  | 10/2005 | Anderson |
| 8,106,669 | B2 | * | 1/2012 | Perras et al. .................. 324/706 |

OTHER PUBLICATIONS

Measurement International Model 6242B 3000Amp Automated Shunt Measurement System Flyer, Nov. 15, 2001.
So, Eddy et al "A computer-controlled current-comparator-based four-terminal resistance bridge for power frequencies", IEEE Trans. on Instrumentation and Measurement, vol. 50, No. 2, 2001, pp. 272-274.

* cited by examiner

*Primary Examiner* — Thomas F Valone
(74) *Attorney, Agent, or Firm* — Akerman LLP

(57) ABSTRACT

A resistance testing apparatus makes use of a modular design for cascaded, parallel, bipolar current sources to obviate the need for electromechanical or pneumatic switching systems.

17 Claims, 4 Drawing Sheets

HIGH CURRENT PRECISION RESISTANCE MEASUREMENT SYSTEM

CROSS REFERENCE TO RELATED APPLICATIONS

This application is a continuation-in-part of U.S. patent application Ser. No. 12/240,191 entitled "High Current Precision Resistance Measurement System" filed Sep. 29, 2008 which claims the benefit of priority to U.S. Provisional Patent Application No. 60/975,544 entitled "High Current Precision Resistance Measurement System" filed Sep. 27, 2007, the contents of which are expressly incorporated herein by reference in their entirety.

FIELD OF THE INVENTION

This invention relates generally to current extenders and precision resistance measurement systems.

BACKGROUND OF THE INVENTION

Testing the resistance of an unknown resistor can be performed in a number of ways. Typically, it involves applying a known voltage across the resistance and measuring the current flow through the resistor, or driving a known current through the resistor and measuring the voltage differential across the resistance. Driving a known current is a commonly preferred technique due to accuracy of current sources and voltmeters in comparison to voltage sources and ammeters.

In conventional testing systems, testing is accomplished by putting an unknown resistance in parallel with a known resistance value. It is common for both the known and unknown resistances to be connected to a common ground. A known current is driven through the circuit, and a voltage reading across the parallel resistance is taken. A simple Ohm's law calculation can be made to determine the resistance of the overall parallel circuit. The parallel combination of two resistances can then be examined to determine the resistance of the unknown resistance. One skilled in the art will appreciate that though the discussion thus far has centered on resistance determinations, the impedance of an element can be determined in the complex plane using the same technique.

Measuring the voltage drop across an element after applying a known current is a preferred technique due to the accuracy of volt meters in comparison to the accuracy of ammeters. To provide high precision measurement systems, the voltmeter must be used in a range that provides a great deal of accuracy. To ensure that the measured voltage is in this region, a large current may be required. For low value resistances, a high driving current is required to prevent the voltmeter from providing results with high percentage errors.

The use of high current sources in measurement systems creates several difficulties, especially where it is important for the power source to be able to reverse the current direction at fixed intervals.

Conventional implementations of high current resistance measurement systems have relied on the use of electro-mechanically and pneumatically actuated relay contacts to reverse the direct current through the resistance device being measured. Commercial power supplies with separate controllers are also used so that the current levels can be measured.

Reversal of the current is employed to mitigate thermal voltage errors that are commonly associated with precision measurement of voltage levels of single digit and lower voltage values. The reversal of the current through the device cancels the thermal voltage error in the measurement process. Because of a requirement to provide very precise measurements, currents are applied that result in measured values on the order of a few hundred millivolts or lower. Current reversal can also be employed to allow equipment to undergo a self calibration routine.

Reversing a current source that is generating a low current is comparatively easy to do, while reversal of a large current source typically involves the use of physical relay switches. The actuation of the relay contacts in conventional systems results in inefficiencies in both space and power consumption. Separate means are also required to operate the contacts, and the contact surfaces must be regularly maintained and inspected to prevent damage due to both mechanical contact and electrical arcing.

Conventional high current reversal systems make use of compressed air actuated plungers and large contact surfaces. This allows for control of the direction of current, and minimizes the resistance across the relay contacts. This requires four independent contact pairs so that current reversal and interconnection of the contacts between the power supply and the measurement instrument is provided.

The use of current comparator technology has been used extensively in the measurement of resistances to high accuracy levels of better than 1 part per million and currents above 3000 amperes. The problems associated with generating and reversing currents above a few hundred amperes were solved with the use of mechanical compressed air operated relay contacts and the combining of multiple commercial power supplies to achieve the necessary current levels. The further commercial exploitation of the technology at the higher current levels has been limited due to the high cost of implementation.

The large physical switches introduce mechanical wear as a source of failure, increase the required maintenance regime, dissipate unnecessary energy, and as they age, become increasingly unreliable without a dedicated maintenance regime.

It is, therefore, desirable to provide a high current resistance measuring system that does not rely upon mechanical switching.

SUMMARY OF THE INVENTION

It is an object of the present invention to obviate or mitigate at least one disadvantage of the prior art switched high current sources.

In a first aspect of the present invention, there is provided a resistance measurements system for generating a bi-polar current. The system comprises a bridge and an extender. The bridge has a controller, a digital to analog converter, a current tracking amplifier and a comparator. The digital to analog converter generates a signal having a defined bi-polar current. The current tracking amplifier generates a signal having a defined bi-polar current, and for transmits the generated signal to a reference resistor. The comparator receives the output of the current tracking amplifier en route to the reference resistor and controls a switch to either connect a secondary input to the bridge to ground, or to connect the output of the converter to a test resistance. The extender has a bi-polar amplifier, and a comparator. The bi-polar amplifier receives the output of the converter in the bridge, amplifies the received converter output, and transmits the amplified current signal as an output. The extender comparator receives the output of the bipolar amplifier, controls a current tracking amplifier to generate a defined bi-polar current, transmits the generated signal to the secondary input to the bridge, and receives the output of the current tracking amplifier en route to the secondary input.

In embodiments of the first aspect of the present invention, the bi-polar amplifier transmits the amplified current signal to the test resistance via the comparator. In another embodiment, each of the digital to analog converter and the current tracking amplifier in the bridge are responsive to the controller, which receives input information from the bridge and extender comparators and controls the generation of output signals from the converter and the bridge amplifier in accordance with predetermined control routines and the received input from the comparators, optionally, the controller determines current ratios between test and reference resistances in accordance with the inputs received from the comparators. In a further embodiment, the bridge comparator controls the switch in accordance with instructions received from the controller, and the switch connects the output of the extender current tracking amplifier to ground, or connects the output of the converter to the test resistance to maintain balance.

In a further embodiment of the first aspect of the present invention, the system further includes a high current extender having a high current bi-polar amplifier and a comparator. The high current bi-polar amplifier receives as an input, the output of the converter, amplifies the received input, and for transmits the amplified signal to the test resistance. The comparator receives the outputs of the high current bi-polar amplifier and the bi-polar amplifier, controls a current tracking amplifier to generate a signal having defined bi-polar current and transmits the generated signal to the input of the bi-polar amplifier in the extender.

In further embodiment, the extender bi-polar amplifier indirectly receives the output of the converter in the bridge through the high current extender. In another embodiment, the controller is responsive to each of the bridge, extender and high current extender comparators, and in accordance with the received inputs controls the generation of output signals from the converter and the bridge amplifier in accordance with predetermined control routines. The controller can be embodied as a processor executing stored instructions in an accessible memory. The controller can be used to determine a current ratio between test and reference resistances in accordance with the inputs received from the comparators. In another embodiment, the comparators are current comparator toroids and the controller determines a current ratio between test and reference resistances in accordance with the inputs received by the comparators and a predetermined winding ratio between the toroids measuring the currents.

In a second aspect of the present invention, there is provided a reference current measurement system for determining the resistance of an unknown test resistance. The system comprises a bridge, an extender and a comparator. The bridge generates a test and reference current, transmits the reference current to a reference resistor, and switches the test current between the test resistance and a bridge output. The extender receives and amplifies the test current from the bridge output, and transmits the amplified test current to the test resistance. The comparator determines a current ratio between the test resistance and the reference resistance, and determines the unknown resistance in accordance with the current ratio.

In an embodiment of the second aspect of the present invention, the comparator includes a series of toroidal current comparators receiving the currents supplied to the test and reference resistances which also transmit the received currents as an output. In another embodiment, the comparator includes a processor for determining the unknown resistance in accordance with the determined current ratio and a winding ratio between each comparator receiving the currents. In a further embodiment, the extender is a high current extender, and the system further includes an intermediate current extender for receiving from the high current extender a low current input signal, for amplifying the low current input signal to obtain an intermediate current signal, and for generating a balance signal. In another embodiment, the intermediate current signal, and the amplified signal from the high current extender are provided to the input of a high current toroid in the comparator, the balance signal and the intermediate current signal are provided to the input of an intermediate current toroid in the comparator, and the balance signal is provided as to the bridge which can be switched to an input to a bridge toroid in the comparator. In a further embodiment to the second aspect of the present invention the comparator includes a processor for determining the unknown resistance in accordance with a determined current ratio between the test and reference resistances and a winding ratio between each toroid receiving the currents.

The present invention provides for a means for measuring low value resistances at high currents. In one embodiment of the present invention, currents up to ±3000 amperes and above are generated and switched, allowing for extremely high accuracy resistance measurements.

In aspects of the present invention numerous advantages can be realized. Electromechanical and pneumatically actuated relays used for reversal of the high current can be obviated, thus allowing a reduction in the size of the testing system, and number of mechanical points of failure. The system can take advantage of directly coupled bi-polar high current amplifiers to supply the positive and negative polarity high test currents required for the measurement of the resistance. This allows for a modular design of components, such as the current amplifier modules and the very high current comparator toroids. The modular nature allows a multiplicity of high test current and resistance measurement ranges to be commercially exploited. The modular nature further allows a base configuration to be later expanded to an augmented configuration without requiring the purchase of a new system.

Automatic micro-processor control of the measurement cycle directly from a main low current comparator measurement bridge in which other system components are directly slaved to the main measurement bridge and full stability of the measurement can be maintained under all measurement conditions is established using the embodiments of the present invention. The present invention provides for a reduction in the total number of high current and control interconnections that are typically employed in integrated measurement systems.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to high current switching precision resistance measurement systems.

The discussion below should be taken to be exemplary in nature, and not as limiting of the scope of the present invention. The scope of the present invention is defined in the claims, and should not be considered as limited by the implementation details described below, which as one skilled in the art will appreciate, can be modified by replacing elements with equivalent functional elements.

The invention is herein described in reference to two exemplary embodiments. It will be understood by one skilled in the art that the particular embodiments discussed should not be considered to be restrictive of the scope of the present invention. The first embodiment provides a modular setup that can be used as a precision resistance measurement system. In many implementations of this embodiment, a limit to the current supplied will be on the order of ±300 Amperes. This setup can also serve as the base for the integration of a higher current system. When operating as the base for the higher current system, this stage of the current source can be configured to provide an output of ±3 A. A second embodiment builds a new stage that is coupled to the modular design of the first embodiment, and is referred to as an Augmented Configuration. This second embodiment couples the base configuration to a very high direct current comparator type of range extender with a series of integrated directly coupled modular bi-polar current amplifiers and a means for directly cascading interconnections through the intermediate level current range extender.

Figure 1:
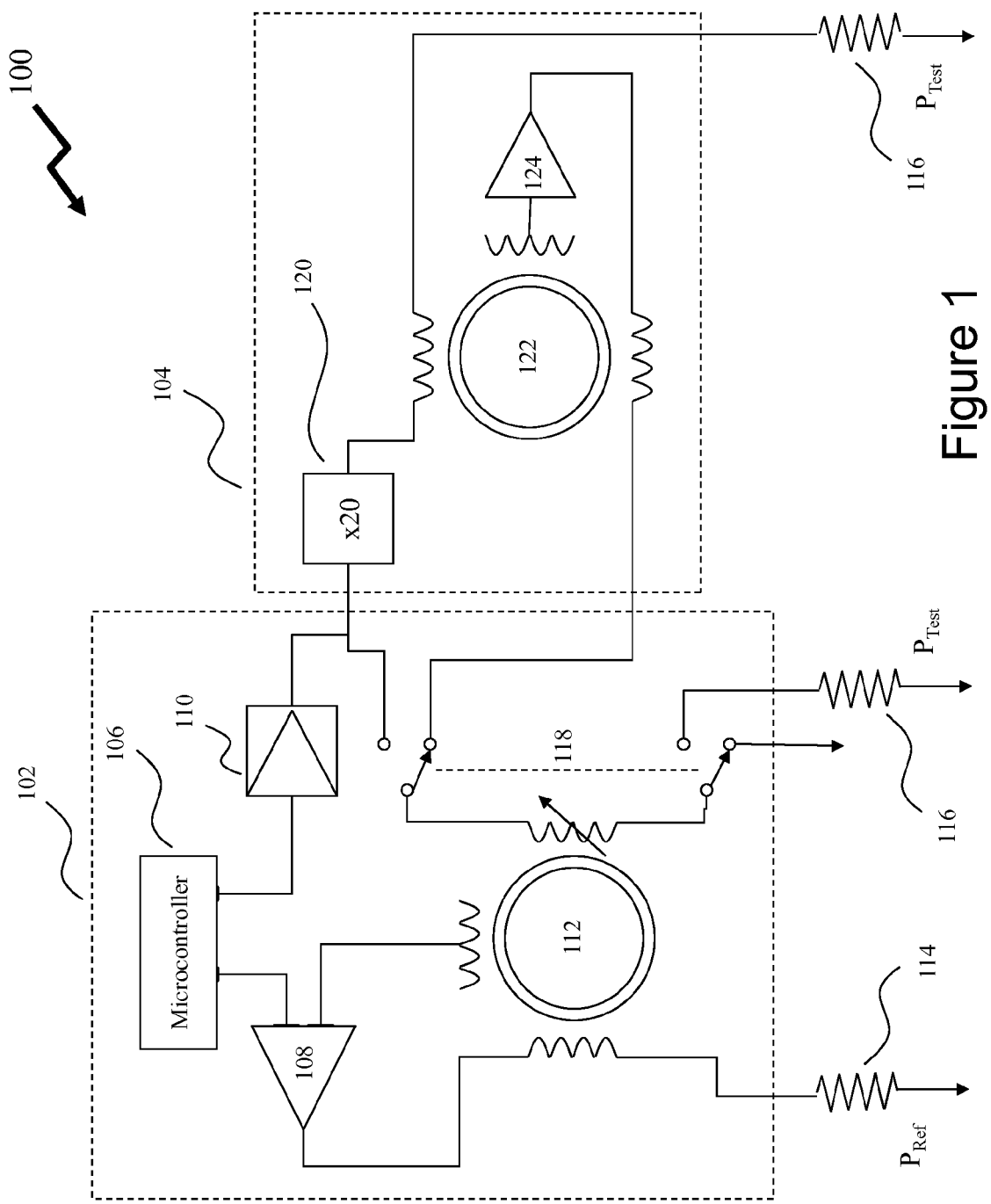
FIG. 1 illustrates a block diagram of a first embodiment of the present invention, referred to as the base configuration.
Figure 2:
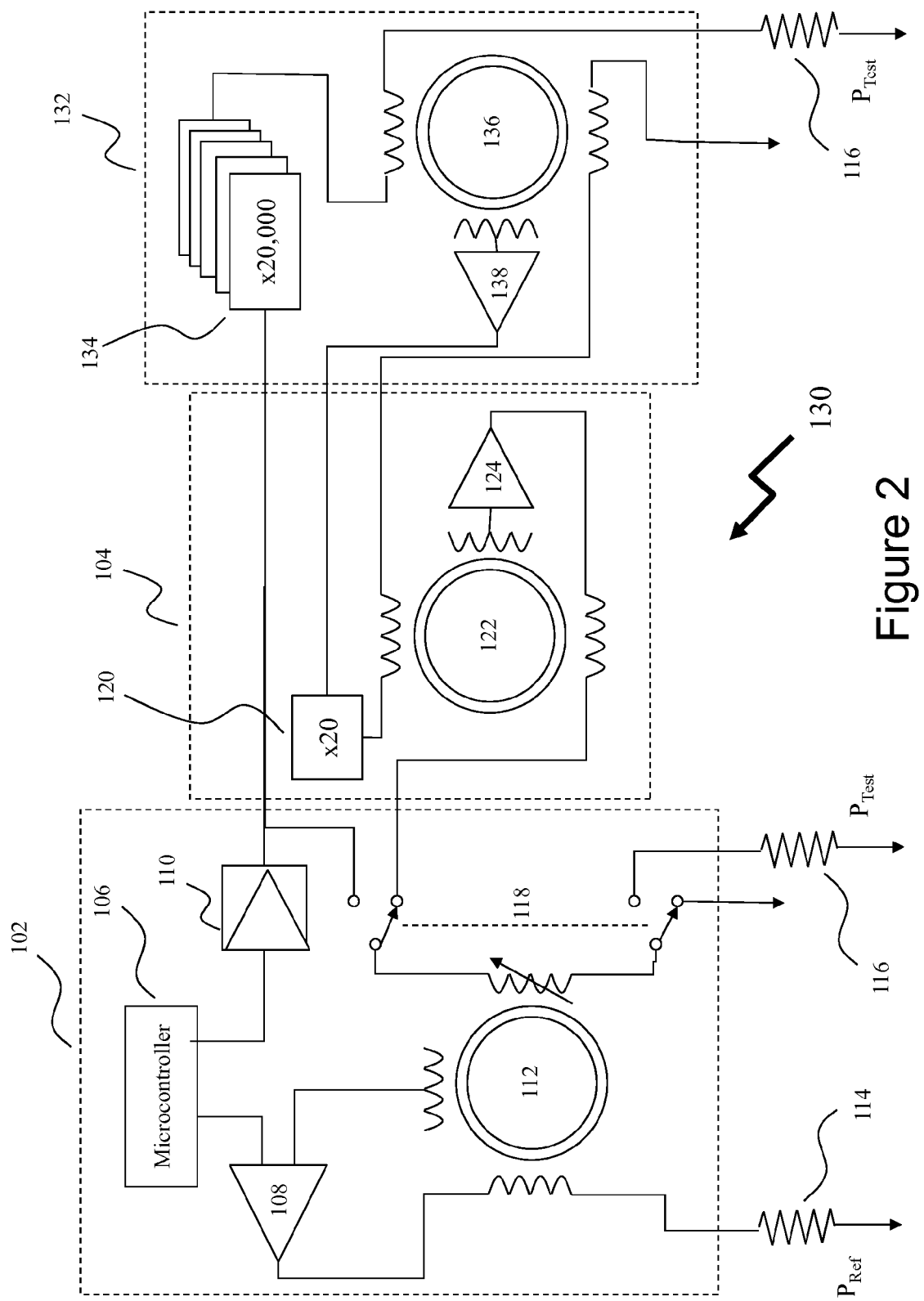
FIG. 2 illustrates a block diagram of a second embodiment of the present invention, referred to as an augmented configuration.

The base configuration of the first embodiment is illustrated in FIG. 1, while the Augmented Configuration of the second embodiment is illustrated in FIG. 2.

As illustrated in FIG. 1, a resistance measurement system 100 makes use of a low current comparator Bridge 102 and an intermediate current range Extender 104. The Bridge 102 generates a bi-polar current as directed by microcontroller 106. Microcontroller 106 controls amplifier 108, which is used to amplify a signal. The amplifier 108 is preferably a servo current tracking amplifier which can produce an output current in the range of 0-±150 mA. The microcontroller 106 also connects to digital to analog converter 110 which also provides an output in the range of 0-±150 mA.

The second input to amplifier 108 is connected to the winding of comparator 112 of the bridge. The 0-±150 mA output of the amplifier 108 is also connected to the winding of comparator 112 before it is connected to the reference resistance (P Ref) 114. A winding of comparator 112 is also connected to a switch 118. In one position, switch 118 will provide a connection to ground that feeds to the intermediate Extender 104. In the second position, it will connect a test resistance (P Test) 116 to allow the bridge to test the resistance with a low current of 0-±150 mA.

The intermediate Extender 104 extends the current test range of Bridge 102 in the system 100. It connects to the Bridge 102 to receive both control information and an input current. Its output is connected to P Test 116 to provide an intermediate level current. In the illustrated embodiment, the intermediate current level is a current range of 0-±3 A due to the use of a 20× amplifier. One skilled in the art will appreciate that a different output current can be obtained by using a different amplifier stage without departing from the scope of the present invention.

The range Extender 104 includes a bipolar DC current amplifier 120 with a range of 0 to ±3 Amperes (or higher in other embodiments) directly coupled to the high current primary winding of the integrated current comparator 122 and a servo amplifier 124 that provides sufficient lower level current through the secondary winding of the current comparator 122 to balance the comparator 122 under all operating conditions. The output of the primary winding is connected to P Test 116 and the output of servo 124 through the extender secondary winding is connected back to the automated resistance Bridge 102 and as such the Bridge 102 can maintain balance within the bridge current comparator 112.

The output of the digital to analog converter 110 in Bridge 102 is the primary input to the intermediate Extender 104. This output is a signal between 0-±150 mA which is provided to a directly coupled bi-polar current amplifier 120. The use of the bipolar amplifier 120 allows the obviation of mechanical switches that are required in the prior art. The manner in which the Extender 104 connects to the Bridge 102 allows the overall system to remain balanced, which is a factor in why the prior art maintained its reliance on the mechanical switches. The output of bi-polar amplifier 120 is passed through the primary winding of comparator 122, and is then provided as an output to the Extender 104 through P Test 116. Another winding on comparator 122 is used as the input to servo tracking amplifier 124, whose output is passed through a third winding on comparator 122. This signal (the output of amplifier 124) is transmitted back to the Bridge 102 which connects the signal to the switch 118. When in the first position (as illustrated in FIG. 1), switch 118 connects this output to ground to balance the measurement system. In the second position, switch 118 connects the output of the digital to analog converter 110 to P Test 116, thus providing a current of 0-±150 mA to P Test 116, as opposed to the output of +0-3 A provided by the output of Extender 104.

This configuration allows the resistance measurement system 100 to perform resistance measurements at much higher currents than the Bridge 102 would be able to as a result of its limitation of 0 to ±150 milliamperes. This increase in the output makes use of the cascaded configuration. The accuracy of the measurement is dependant mainly on the accuracy of the current comparison within the comparators 112 and 122, which is on the order of 1 part in 10 million. In the illustrated implementation, the base configuration can be integrated directly within the main assembly of the low level current comparator resistance measurement Bridge 102 such that no manual connections are required with the exception of connections to the test resistance to be measured. The utilization of the bipolar directly coupled DC current amplifier 120 eliminates the requirement for reversing relays, external current supplies and the resulting complexity of interconnections. The use of a voltmeter to measure the potential drop across the test resistance 116 and reference resistance 114 can be performed as used in the prior art. However, as discussed above, for an accurate reading, the difference in the voltage drops across the test resistance 116 and the reference resistance 114 is driven towards zero, and the comparators 112 and 122 are employed to determine the current ratio directed to the two resistances. Knowing this ratio and the winding ratio of the comparators 112 and 122 allows the system 100 to determine the unknown resistance of P Test 116 to a high degree of accuracy.

An augmented resistance measurement system 130 is illustrated in FIG. 2. The augmented resistance measurement system 130 builds upon the configuration illustrated in FIG. 1 with the addition of a high current comparator extender 132. The extender 132 includes a high current comparator 136 that is connected to a modular bipolar directly coupled high current amplifier 134, a servo amplifier 138, and the output of amplifier 120. The bipolar high current amplifier 134 is directly coupled through the primary winding side of the comparator 136 to the resistance device P Test 116 and can include multiple modules such that full scale currents up to ±3000 Amperes or higher may be attained, preferably in multiples of ±150 Amperes in the present embodiment. Servo amplifier 138 receives its input from comparator 136, and its output is connected back into the input of the intermediate level Extender 104 and is fed to that stage's bipolar current amplifier 120. The output of intermediate current amplifier 120 is coupled through the primary winding of the intermediate level current comparator 122 and also through the secondary winding of the very high current comparator 136 such that both the intermediate comparator 122 and the very high current comparator 136 can maintain current balance under all operating conditions. The configuration is completed with the direct coupling of the output of the servo amplifier 124 of the intermediate level current Extender 104 through the secondary winding of the comparator 122 and the current comparator 112 of the Bridge 102 as described in relation to the embodiment of FIG. 1. The utilization of a modular build up of directly coupled high current amplifiers allows for a multiplicity of current ranges to be implemented and upgraded from ±150 Amperes to ±3000 Amperes (as illustrated in FIG. 2) or higher and also eliminates the requirement for specially designed very high current pneumatically or otherwise mechanically actuated reversing relay contacts, external commercial power supplies and the associated more complex interconnections.

As illustrated in FIG. 2, the Bridge 102 and Extender 104 of the system 130 are configured largely as they were in system 100 of FIG. 1. One notable difference is that the input to Extender 104 is routed through High Current Extender 132 which in turn is connected to Bridge 102. Thus, though the input to Extender 104 is still the output of Bridge 102, it is not a direct connection.

The output of convertor 110, which in this exemplary embodiment is a signal of 0-±150 mA, is provided to high current bipolar amplifiers 134. These amplifiers are preferably parallel amplifiers that allow, in the illustrated embodiment, an amplification of up to 20,000×, allowing for an output signal ranging from 0-±3000 A. One skilled in the art will appreciate that higher or lower amplification ratios can be employed without departing from the scope of the present invention. This output signal is passed through the primary windings of comparator 136 and then provided as an external output of the stage to P Test 116. A Servo Current Tracking Amp 138 receives input from the comparator 136 and provides its output signal, of 0-±150 mA to the input of the Extender 104, which provides the input signal to amplifier 120. The resulting 0-±3 A signal is passed through the primary winding of comparator 122, and then through the secondary winding of comparator 136. The comparator 122 of the Extender 104 is connected back to the Bridge 102 through servo tracking amplifier 124 as was described in FIG. 1.

In a presently preferred embodiment, the amplifier 134 is a modular amplifier that can be built as ±150 A modules connected in parallel to allow for an output of ±3000 A. This allows the test resistance to be supplied a reliable bipolar current of 0-±3000 A which is typically sufficient in most instances to create a potential drop across the resistances that can be measured accurately by the Bridge 102. The known current ratios can then be used to determine the unknown resistance. One skilled in the art will appreciate that other factors can be determined by knowing the current ratios.

The above described implementations of the present invention reduce the space, cost and complexity of operation associated with conventional means of implementing resistance measurements with bi-polar currents above a few hundred amperes in magnitude. These embodiments obviate the requirement for high current polarity reversing relays and external high current power supplies with the associated interconnections that would normally be used.

In the present invention, multiple directly coupled high current amplification modules are integrated. They are preferably connected in parallel through high level current comparators into an automated resistance measurement system. This provides a lower cost means of measuring low value resistances at high currents with a high degree of accuracy and precision. In a presently preferred embodiment the measurement of resistances such as those on the order of 0.1 micro-ohms or lower with measurement currents as high as ±3000 amperes or higher can be performed with accuracies of 1 part per million. The utilization of multiple modules of directly coupled current amplifiers connected in parallel in the resistance measurement systems allows for the elimination of the mechanical switches that are commonly pneumatically or electromechanically controlled. The prior art reliance on these switches increase the cost, interconnections and required maintenance but they were required to provide the reversal of the measurement current utilized to perform the measurements.

One skilled in the art will appreciate that the present system, as discussed above with respect to FIGS. 1 and 2 can be characterized as a microprocessor controlled current comparator resistance measurement bridge. The microprocessor can directly control, either internally or externally, a number of high current amplifiers directly coupled to one or more current comparators. The direct coupling of bi-polar amplifiers, in addition to the microprocessor control allow for the obviation of mechanically, pneumatically or electromechanically actuated relay contacts and support the cascading of the multiple current comparators to augment the measurement current capability of the measurement bridge to ±3000 amperes and above. Modularly designed directly coupled bi-polar high current amplifiers can be combined in multiples of standard values to achieve the desired current range extension. For illustrative purposes multiples of ±150 amperes has been used in the illustrated examples above. The modularly designed current comparators can include a modular low level current servo feedback tracking amplifier that can be simply modified to accommodate measurement current range extension at any current level from less than ±1 ampere to upwards of ±3000 amperes or higher by means of modification of the number of wire turns on one side or the other of the toroidal transformer of a comparator to achieve current ratio extensions of a desired value (e.g. 10 to 1 up to 2000 to 1 or higher). There are also electrical connections to the microprocessor controlled current comparator resistance measurement bridge for current comparator toroidal transformers, low level current tracking servo type amplifiers and directly coupled bi-polar high current amplifiers such that over-all current range extension ratios of any integral value (e.g. up to and above 1,000,000 to 1) can be achieved without the use of mechanically, pneumatically or electromechanically actuated current relay contacts.

A directly coupled bi-polar high current amplifier can include an input current terminal that accepts an electrical signal in positive and negative values needed to make subsequent measurements (e.g. a range of 0 to ±150 milliamperes) and an output current terminal that supplies a current in direct proportion to and in the same polarity (e.g. in the range of from 10 to 1 up to 20,000 to 1) of that of the input or higher. For illustrative purposes with an input signal of ±150 milliamperes the output terminal would provide a current of ±3000 amperes where the proportion is fixed at 20,000 to 1. The fixed proportion can be lower than 10 to 1 (e.g. where an input signal of ±150 milliamperes is provided, the output terminal can provide a current of ±1.5 amperes where the proportion is fixed at 10 to 1). The modules utilized for currents above a base level can have a basic output current provision for up to ±150 amperes or somewhat more or less for an input signal of ±150 milliamperes more or less. The module output terminals can be connected in parallel to increase the output current capability. In one embodiment, 20 or more units can be connected in parallel to provide up to ±3000 amperes or more. The input terminals can also be connected in series such that the all inputs are in effect driven with the same input current in the range of 0 to ±150 milliamperes more or less.

The modularly designed current comparators can be modified to include a modular low level current servo feedback tracking amplifier. This embodiment can include a high current input terminal with direct connection to the output terminal of the directly coupled bi-polar high current amplifier; a high output terminal for direct connection to the input terminal of the resistance device to be measured; a toroidal core of high permeability magnetic material around which is wound a suitable pair of flux detector windings which are utilized to both modulate the core material and provide a means of detecting the presence of flux through the core; a toroidal core magnetic shield around the core that shields the modulating and detecting core windings from undesirable external magnetic influences; a pair of isolated windings around the magnetically shielded core of which one is a single high current path through the core center and another low current winding is a specific number of turns such that the ratio may be of any value from 10 to 1 or lower or as high as 2000 to 1 or higher; and a modular low level current servo feedback amplifier with an input connected directly to the detector windings of the wound core and with a low current output terminal that can be connected directly either through the said low current winding or to the input of a modular directly coupled bi-polar amplifier suitable to maintain an ampere turn balance within the core material. In a presently preferred embodiment the directly coupled bi-polar current amplifier of the lower current comparator is cascaded by connecting the high current amplifier output in series through the higher current winding of the lower current comparator and the lower current winding of the higher current comparator. In such a configuration, the low level current servo feedback amplifier with its input directly connected to the detector windings of the lower current level comparator is connected in series through the low current windings of the same lower current comparator such as to maintain ampere-turn balance within its core material and with provision of a low current terminal for direct connection to the current comparator of the measurement bridge.

The comparator of the measurement bridge can be modified to include an input and an output terminal as well as a means for electronically controlling the measurement. The output terminal can be directly connected to the input terminal of the directly coupled bi-polar high current amplifier. This allows for the high current output of the bi-polar high current amplifier to be controlled. The input terminal can be directly connected to the output terminal of the lower current comparator as a means of maintaining ampere-turn balance of the resistance measurement bridge current comparator. There can also be a means for electronically controlling the measurement process such that the desired current output to the resistance to be measured is directly controlled by the resistance measurement bridge and the resistance ratio of the resistance being measured to that of a reference resistance can be measured and displayed automatically.

Figure 3:
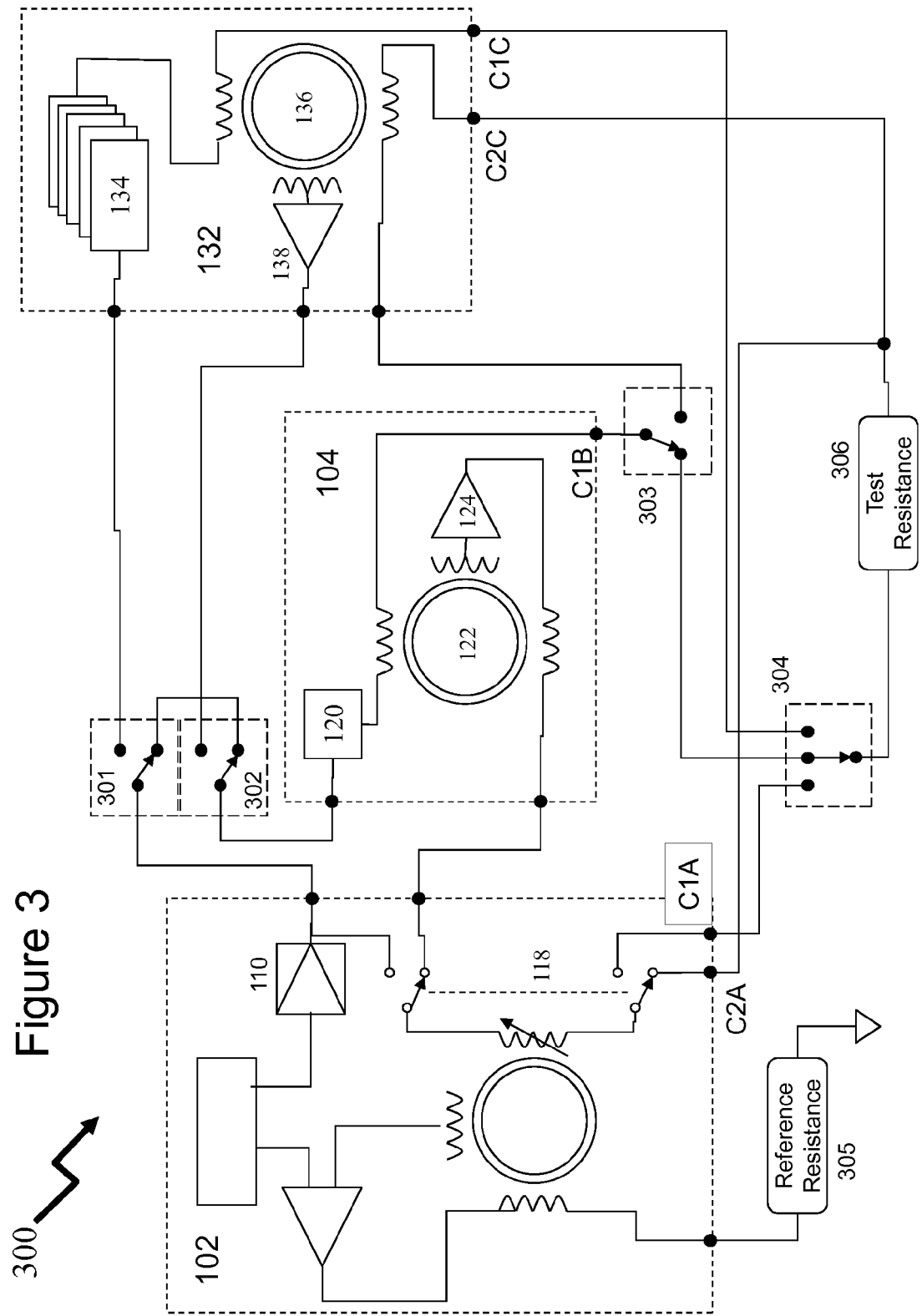
FIG. 3 illustrates a block diagram of a re-configurable implementation of the augmented configuration.

Referring to FIG. 3 there is depicted a re-configurable implementation of the augmented resistance measurement system 130 as described and depicted in FIG. 2. Accordingly re-configurable system 300 comprises the Bridge 102 and Extender 104 as discussed supra in respect of FIGS. 1 and 2 are depicted together with the high current extender 132 as discussed supra in respect of FIG. 2. As such the re-configurable system 300 may provide three output current ranges to the test resistance 306 based upon the configuration of the first to fourth configuration switches 301 through 304 respectively. In a first configuration the output of the DAC 110 is routed by switch 118 to the bridge output C1A of the Bridge 102. In a second configuration the output of the DAC 110 is routed to the amplifier 120 within the Extender 104 and thereby to the extender output C1B of the Extender 104. In a third configuration the output of the DAC 110 is routed to the high current bipolar amplifiers 134 within the High Current Extender 132 and therein to the high current extender output C1C. Coupling these three outputs to the fourth configuration switch 304 allows the selected current range, for example ±150 mA, ±3 A, or ±3000 A, to be coupled to the test resistance 306. The other side of the test resistance 306 being coupled to bridge input port C2A of Bridge 102 and extender input port C1B of High Current Extender 132. First and second configuration switches 301 and 302 manage the routing of the output of the DAC 110 to the Extender 104 and High Current Extender in the second and third configurations and the routing of the Servo Current Tracking Amp 138 to the input of amplifier 120 in the third configuration. Third configuration switch 303 manages routing of the output port of the amplifier 120 between the fourth configuration switch 304 and comparator 136 in the second and third configurations respectively.

Accordingly, where the first to fourth configuration switches 301 through 304 are controlled through a controller, not shown for clarity, together with switch 118 then the re-configurable system 300 provides multiple programmable output ranges such as the ±150 mA, ±3 A, or ±3000 A discussed above provided by exemplary embodiments of the Bridge 102, Extender 104, and High Current Extender 132. It would be evident to one skilled in the art that the re-configurable system 300 may be implemented in a modular manner such as for example by providing Bridge 102, Extender 104, and High Current Extender 132 as discrete units together with first to fourth configuration switches 301 through 304. Alternatively as first to third configuration switches 301 and 304 relate to interconnections and input/outputs of Extender 104 and High Current Extender 132 these may be provided within a single module with the High Current Extender 132. It would also be evident that the High Current Extender 132 which within the embodiments above provides ×20,000 multiplication of the output of the DAC 110 may be similarly implemented in modular format either through multiple amplifier stages with single comparator stage or multiple High Current Extenders 132 with appropriate switching elements. It would be further evident that the fourth configuration switch 304 may alternatively be a 1:4, 1:5, 1:6, of 1:N switch rather than the 1:3 switch depicted.

High Current Extender 132 in FIGS. 2 and 3 is depicted as being implemented with multiple high current bipolar amplifiers 134. Accordingly High Current Extender 132 may provide multiple output current ranges with the provision of additional primary windings with appropriate switching elements to provide more output current options. Alternatively it would be evident to one skilled in the art that the multiple high current bipolar amplifiers 134 may be similarly switchably engaged thereby providing additional output current ranges for the resistance measurement systems described above in respect of FIGS. 2 through 4. It would also be evident that alternatively multiple High Current Extenders 132 may be employed with different gain factors and maximum output current range to provide a modular approach to currents of ±3000 A or higher.

Figure 4:
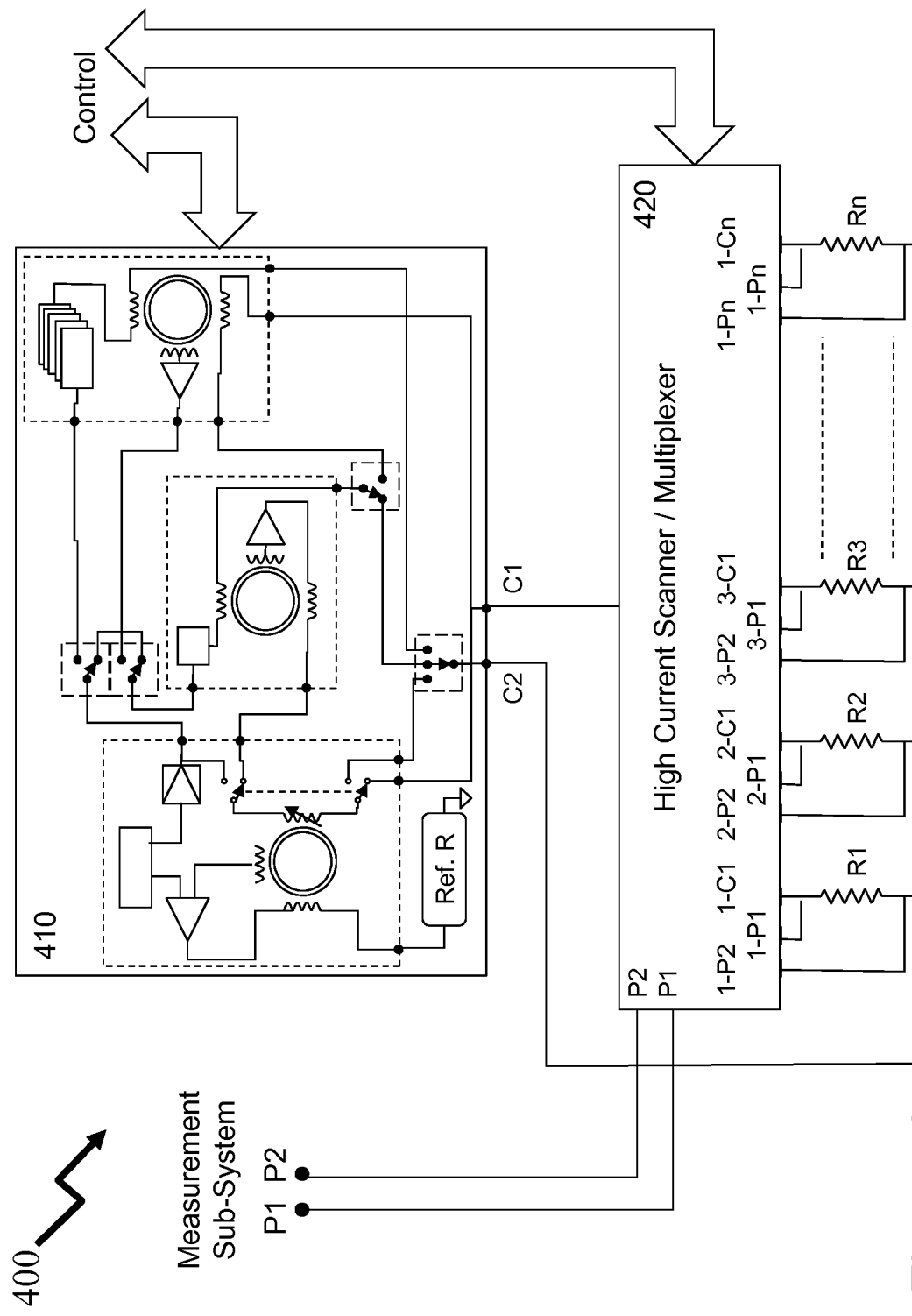
FIG. 4 illustrates a block diagram of a test environment employing the re-configurable implementation of the augmented configuration in conjunction with a high current scanner/multiplexer.

Now referring to FIG. 4 there is depicted an automated multiple resistance measurement system 400 according to an embodiment of the invention. As depicted multiple resistors R1, R2, . . . , Rn are coupled to a High Current Scanner/Multiplexer 420 to which a Current Measurement System 410 is connected, such as discussed above in respect of FIG. 3 with re-configurable system 300 which is a programmable version of augmented resistance measurement system 130 described in respect of FIG. 2 above. Also depicted is a control channel which provides control signals to the High Current Scanner/Multiplexer 420 and Current Measurement System 410 through a standard interface/protocol including, but not limited, to RS232, IEEE-488, USB, Ethernet and I2C. The output port C1 of the Current Measurement System 410 corresponds to the output of the fourth configuration switch 304 and the port C2 to the connection at the other end of the test resistance 306 coupled to C2A and C2C in FIG. 3. Accordingly each resistor R1, R2, . . . , Rn is thereby connected to C1 at one end through the High Current Scanner/Multiplexer 420 and to C2 at the other end.

Additionally the potential output connections x–P1 and x–P2, where x represents the resistor position with respect to High Current Scanner/Multiplexer 420, are routed through the High Current Scanner/Multiplexer 420 to a measurement sub-system such as a Bridge 102 for example for measurement purposes. Accordingly it would be evident that automated multiple resistance measurement system 400 allows for multiple resistances to be characterized over one or more bipolar current ranges produced by the Current Measurement System 410 with high precision. Optionally the outputs P1 and P2 are another bridge. It would also be evident that the control channel which provides control signals to the High Current Scanner/Multiplexer 420 and Current Measurement System 410 may be a separate microprocessor based controller or may be the microcontroller 106 within the Bridge 102.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A programmable resistance measurement system for generating a bi-polar current comprising:
    a bridge having
    a controller,
    a digital to analog converter for generating a first signal having a defined bi-polar current,
    a first current tracking amplifier for generating a second signal having a defined bi-polar current, and for transmitting the generated second signal to a reference resistor,
    a first comparator for receiving the output of the first current tracking amplifier en route to the reference resistor and for controlling a switch to place the bridge into a first state and a second state, the first state connecting a secondary input of the bridge to ground and the second state connecting the output of the digital to analog converter to an output of the bridge;
    an extender having
    a bi-polar amplifier for receiving in a first configuration an output of the digital to analog converter in the bridge and in a second configuration an output of a servo current tracking amplifier in a high current extender, for amplifying the received output, and for transmitting the amplified current signal as an output of the extender, and
    a second comparator for receiving the output of the bipolar amplifier, for controlling a second current tracking amplifier to generate and transmit a signal having a defined bi-polar current to the secondary input of the bridge, and for receiving the output of the second current tracking amplifier en route to the secondary input of the bridge; and
    a high current extender having
    a high current bi-polar amplifier for receiving as an input in the second configuration the output of the digital to analog converter, for amplifying the received input, and for transmitting the amplified signal as an output; and
    a high current comparator for receiving the outputs of the high current bi-polar amplifier and the bi-polar amplifier in the second configuration for controlling the servo current tracking amplifier to generate and transmit a signal having defined bi-polar current to the input of the bi-polar amplifier in the extender; and
    a switching matrix having;
    a first switch circuit for in the first configuration coupling the output of the digital to analog converter in the bridge to the bi-polar amplifier in the extender and in the second configuration coupling the output of the digital to analog converter in the bridge to high current bi-polar amplifier in the high current extender and the output of the servo current tracking amplifier in the high current extender to the input of the bi-polar amplifier in the extender;
    a second switch circuit for in the first configuration coupling the output of the bi-polar amplifier in the extender to an output of the programmable resistance measurement system, in the second configuration coupling the output of the bi-polar amplifier in the extender to the high current comparator in the high current extender and the output of the high current extender to the output of the programmable resistance measurement system, in a third configuration coupling the output of the bridge to the output of the programmable resistance measurement system.

2. The programmable resistance measurement system of claim 1 wherein, the switching matrix is provided with at least one of the extender and the high current extender in a module combining the switching matrix with the at least one of.

3. The programmable resistance measurement system of claim 1 wherein, a first predetermined portion of the first switch circuit is provided with the extender and a second predetermined portion of the first switch circuit is provided with the high current extender; and
    a third predetermined portion of the second switch circuit is provided with the extender and a fourth predetermined portion of the second switch circuit is provided with the high current extender.

4. The programmable resistance measurement system of claim 1 further comprising:
    a high current multiplexer having;

an input port coupled to the output of the programmable resistance measurement system for receiving the programmable bi-polar output current in each configuration;

a plurality of test resistance ports, each test resistance port for coupling to a test resistance to be measured and receiving at first and second inputs first and second signals generated respectively from either end of the test resistance; and a third switch circuit for coupling the input port to each test resistance port of the plurality of test resistance ports and the respect first and second inputs to first and second output ports of the high current multiplexer.

5. The programmable resistance measurement system of claim 1 wherein, each of the digital to analog converter and the current tracking amplifier in the bridge are responsive to the controller, which receives input information according to the configuration from at least one of the bridge comparator, extender comparator, and high current extender comparator and controls the generation of output signals from the digital to analog converter and the current tracking amplifier in the bridge in accordance with predetermined control routines and the received input from the comparators.

6. The programmable resistance measurement system according to claim 5 wherein, the controller at least one of determines current ratios between test and reference resistances in accordance with the inputs received and is embodied as a processor executing stored instructions in a non-volatile memory.

7. The programmable resistance measurement system according to claim 1 wherein, at least one of the bridge comparator, extender comparator, and high current extender comparator is a current comparator toroid.

8. The programmable resistance measurement system according to claim 7 wherein, the controller determines a current ratio between test and reference resistances in accordance with the inputs received by the comparators and a predetermined winding ratio between the toroids measuring the currents.

9. The programmable resistance measurement system according to claim 1 wherein, the high current bi-polar amplifier provides multiple outputs, each output having a predetermined maximum bi-polar current; and the high current comparator is a current comparator toroid with multiple primary windings, each primary winding relating to an output of the plurality of outputs; and the high current extender further comprises a third switching matrix to selectively provide only one output of the multiple outputs to be coupled via its respective primary winding to the output of the high current extender.

10. A programmable resistance measurement system for generating a bi-polar current comprising:

a bridge having a controller coupled a digital to analog converter and a first current tracking amplifier, the digital to analog converter for generating a first signal having a defined bi-polar current in response to a first received controller input, the first current tracking amplifier for generating a second signal having a defined bi-polar current in response to a second received controller input and a comparator input for receiving a third signal from a first comparator, and for transmitting a generated second signal to a reference resistor output;

the first comparator for receiving the output of the first current tracking amplifier en route to the reference resistor, generating the third signal, and for controlling a switch to place the bridge into one of a first state and a second state, wherein in the first state a secondary input of the bridge is connected to ground such that the first signal from the digital to analog converter is coupled only to a first output of the bridge; and in the second state the first signal from the digital to analog converter is coupled to a second output of the bridge to provide the bi-polar current to a resistance being characterised;

an extender having a bi-polar amplifier for receiving an output of a servo current tracking amplifier in a high current extender, for amplifying the received output, and for transmitting the amplified current signal as an output of the extender, and a second comparator for receiving the output of the bipolar amplifier, for controlling a second current tracking amplifier to generate and transmit a signal having a defined bi-polar current to the secondary input of the bridge, and for receiving the output of the second current tracking amplifier en route to the secondary input of the bridge; and a high current extender having a high current bi-polar amplifier for receiving the output of the digital to analog converter, for amplifying the received input, and for transmitting the amplified signal as an output to a first high current extender output; and a high current comparator for receiving the outputs of the high current bi-polar amplifier and the bi-polar amplifier for controlling the servo current tracking amplifier to generate and transmit a signal having defined bi-polar current to the bi-polar amplifier in the extender.

11. The programmable resistance measurement system according to claim 10, wherein the bi-polar amplifier within the extender is alternatively selectively coupled to the second output of the bridge for receiving the output of the digital to analog converter in the bridge, amplifying the received output, and for transmitting the amplified current signal as an output of the extender.

12. The programmable resistance measurement system according to claim 11 wherein;

in the first state a test resistance coupled to the second output of the bridge is automatically characterised from a first predetermined negative current to a second predetermined positive current through the controller generating a series of first received controller outputs to at least one of the digital to analog converter and first current tracking amplifier whilst a predetermined reference resistance is coupled to the reference resistor output of the bridge.

13. The programmable resistance measurement system according to claim 10 wherein;

in the first state a test resistance coupled to the first high current extender output is automatically characterised from a first predetermined negative current to a second predetermined positive current through the controller generating a series of first received controller outputs to at least one of the digital to analog converter and first current tracking amplifier whilst a predetermined reference resistance is coupled to the reference resistor output of the bridge.

14. The programmable resistance measurement system according to claim 13 wherein, the high current bi-polar amplifier provides multiple outputs, each output having a predetermined maximum bi-polar current; and the high current comparator is a current comparator toroid with multiple primary windings, each primary winding relating to an output of the plurality of outputs; and the high current extender further comprises a third switching matrix to selectively provide only one output of the multiple.

15. A resistance measurement system for determining an unknown resistance in dependence upon at least a ratio of a test current and a reference current, each current established through setting a state of the resistance measurement system into each of a first state and a second state, the resistance measurement system for generating a bi-polar current, and comprising:

a bridge having a controller coupled a digital to analog converter and a first current tracking amplifier, the digital to analog converter for generating a first signal having a defined bi-polar current in response to a first received controller input, the first current tracking amplifier for generating a second signal having a defined bi-polar current in response to a second received controller input and a comparator input for receiving a third signal from a first comparator, and for transmitting a generated second signal to a reference resistor output;

the first comparator for receiving the output of the first current tracking amplifier en route to the reference resistor, generating the third signal, and for controlling a switch to place the bridge into one of a first state and a second state, wherein in the first state a secondary input of the bridge is connected to ground such that the first signal from the digital to analog converter is coupled only to a first output of the bridge; and in the second state the first signal from the digital to analog converter is coupled to a second output of the bridge;

an extender having a bi-polar amplifier for coupling to the second output of the bridge, receiving the output of the digital to analog converter in the bridge, amplifying the received output, and for transmitting the amplified current signal as an output of the extender, and a second comparator for receiving the output of the bipolar amplifier, for controlling a second current tracking amplifier to generate and transmit a signal having a defined bi-polar current to the secondary input of the bridge, and for receiving the output of the second current tracking amplifier en route to the secondary input of the bridge; and a switching matrix having a first switch circuit for in a first configuration coupling the output of the digital to analog converter in the bridge to the bi-polar amplifier in the extender and in a second configuration coupling the output of the digital to analog converter in the bridge to high current bi-polar amplifier in the high current extender and the output of the servo current tracking amplifier in the high current extender to the input of the bi-polar amplifier in the extender;

a second switch circuit for in the first configuration coupling the output of the bi-polar amplifier in the extender to the unknown resistance, in the second configuration coupling the output of the bi-polar amplifier in the extender to the high current comparator in the high current extender and the output of the high current extender to the unknown resistance, and in a third configuration coupling the output of the bridge to the unknown resistance.

16. The resistance measurement system according to claim 15, wherein in the first state a test resistance coupled to the extender output is automatically characterised from a first predetermined negative current to a second predetermined positive current through the controller generating a series of first received controller outputs to at least one of the digital to analog converter and first current tracking amplifier whilst a predetermined reference resistance is coupled to the reference resistor output of the bridge.

17. The resistance measurement system according to claim 15, wherein in the second state a test resistance coupled to the second output of the bridge is automatically characterised from a first predetermined negative current to a second predetermined positive current through the controller generating a series of first received controller outputs to at least one of the digital to analog converter and first current tracking amplifier whilst a predetermined reference resistance is coupled to the reference resistor output of the bridge.

* * * * *